United States Patent [19]

Liaw et al.

[11] Patent Number: 4,786,615
[45] Date of Patent: Nov. 22, 1988

[54] METHOD FOR IMPROVED SURFACE PLANARITY IN SELECTIVE EPITAXIAL SILICON

[75] Inventors: Hang M. Liaw, Scottsdale; Ha T.-T. Nguyen, Mesa, both of Ariz.

[73] Assignee: Motorola Inc., Schaumburg, Ill.

[21] Appl. No.: 92,267

[22] Filed: Aug. 31, 1987

[51] Int. Cl.$^4$ .................. H01L 21/205; H01L 21/76
[52] U.S. Cl. .............................. 437/89; 148/DIG. 25; 148/DIG. 26; 148/DIG. 50; 156/613; 437/112; 437/970; 437/90
[58] Field of Search ............... 148/DIG. 29, DIG. 26, 148/DIG. 25, 169; 156/610–614; 427/51; 437/89, 90, 99, 103, 108, 112, 970

[56] References Cited

U.S. PATENT DOCUMENTS

| | | | |
|---|---|---|---|
| 3,575,731 | 4/1971 | Hoshi et al. | 457/90 |
| 3,740,276 | 6/1973 | Bean | 437/89 |
| 3,764,409 | 10/1973 | Nomura et al. | 437/90 |
| 3,793,712 | 2/1974 | Bean et al. | 437/89 |
| 4,101,350 | 7/1978 | Possley et al. | 437/89 |
| 4,141,765 | 2/1979 | Druminski et al. | 437/90 |
| 4,346,513 | 8/1982 | Nishizawa et al. | 156/613 |
| 4,349,394 | 9/1982 | Wei | 437/108 |
| 4,400,411 | 8/1983 | Yuan et al. | 156/614 |
| 4,497,683 | 2/1985 | Celler et al. | 437/112 |
| 4,522,662 | 6/1985 | Bradbury et al. | 437/90 |
| 4,547,231 | 10/1985 | Hine | 437/90 |
| 4,578,142 | 3/1986 | Corboy, Jr. et al. | 156/612 |
| 4,579,621 | 4/1986 | Hine | 156/612 |
| 4,592,792 | 6/1986 | Corboy, Jr. et al. | 156/612 |
| 4,637,127 | 1/1987 | Kurogi et al. | 156/612 |

OTHER PUBLICATIONS

Klein, "Contour Deposition-A New Epitaxial Deposition Technique . . . ", Solid-State Electronics, vol. 9, 1966, pp. 959–966.

Endo et al., "Novel Device Isolation Technology with Selective Epitaxial Growth", IEEE, IEDM, vol. ED-31, No. 9, Sep. 1984, pp. 1283–1288.

Tanno et al., "Selective Silicon Epitaxy Using Reduced Pressure Technique", Jap. J. Appl. Phys., vol. 21, No. 9, Sep. 1982, pp. 564–566.

Liaw et al., "Epitaxial Silicon for Bipolar Integrated Circuits", Solid State Technology, May 1984, pp. 135–143.

Borland et al., "Advanced Dielectric Isolation Through Selective Epitaxial Growth", Solid State Technology, Aug. 1985, pp. 141–148.

Ishitani et al., "Facet Formation in Selective Silicon Epitaxial Growth", Jap. J. Appl. Phys., vol. 24, No. 10, Oct. 1985, pp. 1207–1209.

Primary Examiner—Brian E. Hearn
Assistant Examiner—William Bunch
Attorney, Agent, or Firm—Joe E. Barbee

[57] ABSTRACT

A method for growing selective epitaxial silicon by chemical vapor deposition resulting in a substantially planar surface by growing superimposed silicon layers at temperatures above and below a transition point.

5 Claims, 1 Drawing Sheet

METHOD FOR IMPROVED SURFACE PLANARITY IN SELECTIVE EPITAXIAL SILICON

BACKGROUND

This invention pertains to a method for improved surface planarity in selective epitaxial silicon. The growth of selective epitaxial silicon required to form a patterned mask on the substrate surface. The mask can be made of a single layer material such as silicon dioxide or silicon nitride. However, in certain device applications (such as sidewall base contact bipolar transistors) the mask needs to use multilayered materials which are sequentially deposited on the substrate main surface. An example of the multi-layered mask is a parallel stacking of silicon dioxide, doped polysilicon, and silicon dioxide. The mask is then patterned by the photolithographic method followed by reactive ion etching to remove certain regions defined by the lithographic pattern. The selective epitaxial growth (SEG) technique is applied to deposit silicon only inside the etched grooves but not on the mask surface. When selective epitaxial silicon is to be used for the IC device fabrication, its thickness needs to be controlled to the same height as that of the mask.

The selective epitaxial growth (SEG) of silicon is typically carried out by chemical vapor deposition at a fixed temperature. In prior art it has been observed that a planar surface is very difficult to obtain. The non-planarity mainly occurs at the epitaxy/mask interface. There are two main non-planar surface morphologies that are a problem. One is the enhanced deposition of silicon around the edges of grooves or trenches. This morphology is often observed when the sidewalls of the mask contain polysilicon. The other is facet formation due to a slower deposition at the edges of grooves. Any of non-planar surface morphologies are not desirable for high density IC device fabrication.

SUMMARY OF THE INVENTION

The present invention pertains to the growth of selective epitaxial silicon with a planar surface. Using chemical vapor deposition epitaxial silicon is grown in selected areas in two stages. The surface morphology of the silicon is different for the different temperatures at which each stage is grown. Thus, the surface morphology of one stage is compensated by the surface morphology of the other stage resulting in a planar surface.

It is an object of the present invention to provide a new and improved method for selective epitaxial growth.

It is a further object of the present invention to provide selective epitaxial silicon with a planar surface.

These and other objects of the present invention will become apparent to those skilled in the art upon consideration of the accompanying specification, claims and drawings.

DESCRIPTION OF THE PREFERRED EMBODIMENT

Figure 1:
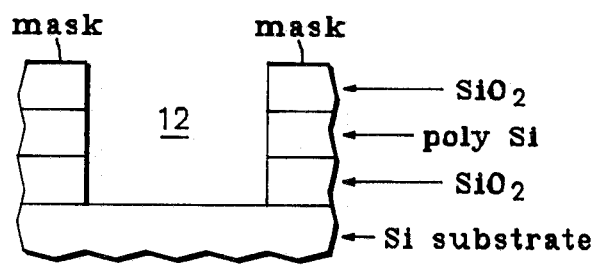
FIG. 1 is a simplified cut-away view of the multilayered patterned mask on a substrate used for selective epitaxial growth.

FIG. 1 illustrates a substrate patterned for selective epitaxial growth. The selected area for silicon epitaxial growth is defined by a mask consisting of layers of $SiO_2$/polysilicon/$SiO_2$ which in this example, forms a groove or well 12 in which epitaxial silicon is grown.

Figure 2:
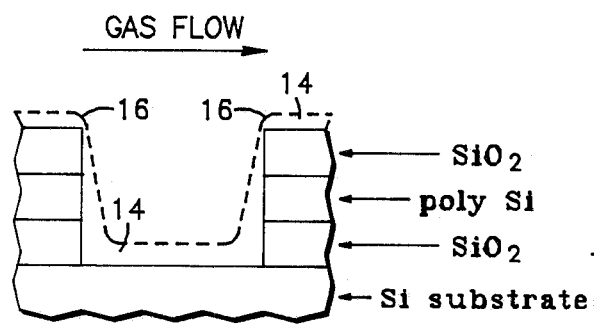
FIG. 2 is a cut-away side view of the boundary layer over a patterned substrate.

Epitaxial silicon grown by the chemical vapor deposition (CVD) method includes two major rate limiting mechanisms for the mass transport of silicon atoms. The first mechanism involves the transport of silicon containing gases through a boundary or stagnant layer 14 at the substrate gas interface on the substrate surface as shown in FIG. 2. The second mechanism involves the transport of adsorbed silicon atoms or molecules from the landing sites to surface ledges or kinks for incorporation into the crystal lattice. Transition of the rate limiting mechanism occurs at a temperature of approximately 975° C. for silicon deposited from dichlorosilane. At temperatures above the transition point, the first mechanism is the rate limiting step, while at temperatures below the transition point the second mechanism becomes the slowest step.

Figure 3A:
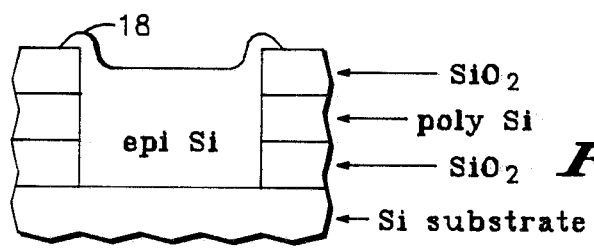
FIG. 3A is a cut-away side view of the surface morphology of epitaxial silicon grown at a first temperature.

FIG. 3a shows the surface morphology of epitaxial silicon grown at a temperature above the transition point so that transport of silicon containing gases through a boundary layer at the substrate gas interface onto the substrate surface is the rate limiting step. Since the diffusion of silicon containing gases through the boundary layer is the rate determining step, it has been found that where the boundary layer is the thinnest, epitaxial silicon build-up occurs. In FIG. 2 it can be seen that boundary layer 14 is thinnest at the edges 16 of the well or groove 12. Thus, at higher temperatures, silicon tends to build up in this area to form bumps 18 on the epitaxial silicon surface, as shown in FIG. 3a.

Figure 3B:
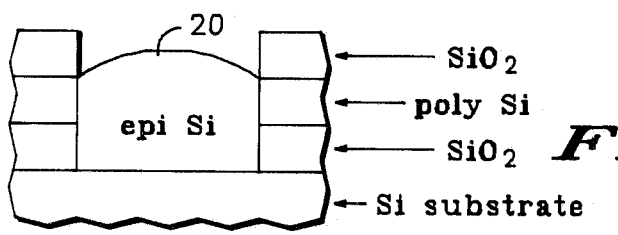
FIG. 3B is a cut-away side view of the surface morphology of epitaxial silicon grown at a second temperature.

At temperatures below the transition point, surface non-planarity arises from the formation of facets. The facet formation is a result of minimization of surface free energy. Applicants have used a substrate with a (100) orientation which does not exhibit the lowest surface free energy. When a silicon island 20 as shown in FIG. 3b grows upward from the bottom of groove 12, the upper edges of the island will become exposed to various crystallographic orientations. An orientation which exhibits a lower surface free energy than that in (100) will increase in area at the expense of (100) surface. The most commonly observed side facets have been identified as a (311) orientation. Thus, the facets with orientation that have lower surface free energy than the surface orientation, will result in growths of facets away from the sides of the mask, resulting in non-planar surfaces.

Figure 4:
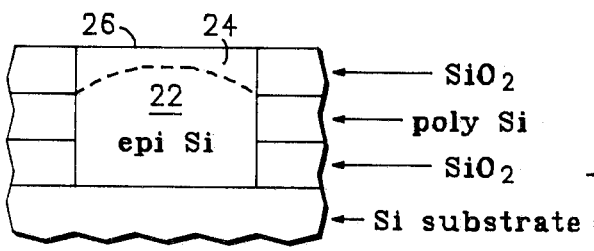
FIG. 4 is a cut-away side view of the surface morphology of epitaxial silicon resulting from growth at the first and second temperature.

With the finding of the two major mechanisms applicants have developed a method for growing selective epitaxial silicon by CVD using dichlorosilane resulting in a planar surface by utilizing both rate limiting steps as shown in FIG. 4. A lower portion of the epitaxial silicon 22, is grown at one temperature while the upper portion 24 is grown at another temperature to provide two superimposed layers that form a planar surface 26.

In this embodiment, the lower portion 22 was grown at a temperature below the transition point, while the upper portion 24 which compensates for the lower portion, was grown at a temperature above the transition point. In order to control the planarity of the surface, the amount of epitaxial silicon grown at each temperature can be varied. Also, either the first limiting step or the second limiting step can be used to grow the first portion while the other limiting step can be used to grow the second portion. Experiments have been carried out using 950° and 1000° C. as two sequential growth temperatures for a given SEG run. The results show the improved surface planarity 26 as shown in FIG. 4.

There is thus provided by the present invention a substantially improved method for growing selective epitaxial silicon. By using chemical vapor deposition at two temperatures to grow epitaxial silicon a much more controllable and a higher yield of planar surfaces results.

Having thus described the invention it will be apparent to those skilled in the art that various modifications can be made within the spirit and scope of the present invention. For example, while the selective epitaxial silicon was grown by chemical vapor deposition at two temperatures in two steps, it will be apparent to those skilled in the art that further steps could be used alternating the growth of the epitaxial silicon at the two temperatures. Also, while 950° C. and 1000° C. were used as the two temperatures in which to grow the epitaxial silicon, it should be understood by those skilled in the art that as long as one temperature is below the transition point and one temperature is above the transition point these temperatures could be varied. Further, while the transition point for dichlorosilane is at approximately 975° C., it should be understood that other silicon containing gases used for silicon deposition may have different transition points.

This technique can also be applied to chemical vapor depostion of other materials on a patterned substrate. The transition temperature for the change of rate controlled mechanisms can be determined experimentally by evaluating the temperature at which the value of activation energy for deposition is changed.

We claim:

1. A method for improved surface planarity in selective epitaxial silicon growth comprising the steps of:
providing a substrate with a mask having at least one aperture;
growing two superimposed layers of selective epitaxial silicon in the aperture at two different temperature separated by a transition point while substantially avoiding indiscriminate growth of silicon on the mask;
one of said layers being grown at a temperature lower than the transition point;
the other one of said two layers being grown at a temperature higher than the transition point; and
terminating the growth of selective epitaxial silicon when the selective epitaxial silicon is substantially planar with the mask.

2. A method for improved surface planarity in selectively epitaxial silicon growth comprising the steps of:
providing a substrate with a mask having at least one aperture;
growing two superimposed layers of epitaxial silicon in the aperture at two different temperatures separated by a transition point while substantially avoiding indiscriminate growth of silicon on the mask;
one of said two layers being grown by chemical vapor deposition at a temperature where the rate determining step is the transport of adsorbed silicon;
the other one of said two layers being grown by chemical vapor deposition at a temperature where the rate determining step involves the transport of silicon containing gases through a boundary layer; and terminating the growth of selective epitaxial silicon when the selective epitaxial silicon is substantially planar with the mask.

3. A method as claimed in claim 1 wherein the transition point is a temperature at approximately 975° C.

4. A method for improved surface planarity in selective epitaxial silicon growth comprising the steps of:
growing at least two superimposed layers of epitaxial silicon by using at least two different temperatures in a silicon containing gas selected from any of the following; $SiCl_4$, $SiH_2Cl_2$, $SiH_4$, $SiHCl_3$; and
said layers being selectively grown in an aperture of a mask, while substantially avoiding deposition on the mask; and terminating the growth of selective epitaxial silicon when the selective eptaxial silicon is substantially planar with the mask.

5. A method as claimed in claim 4 wherein the mask in comprised of one or any combination of $SiO_2$, $Si_3N_4$, and polysilicon.

* * * * *

UNITED STATES PATENT AND TRADEMARK OFFICE
CERTIFICATE OF CORRECTION

PATENT NO. : 4,786,615

DATED : Nov. 22, 1988

INVENTOR(S) : Hang M. Liaw et al.

It is certified that error appears in the above-identified patent and that said Letters Patent is hereby corrected as shown below:

Column 4, Claim 1, line 2, change "temperature" to -- temperatures --.

Column 4, Claim 2, line 13, change "selectively" to -- selective --.

Column 4, Claim 5, line 47, change "in" to -- is --.

Signed and Sealed this

Twenty-fifth Day of April, 1989

Attest:

DONALD J. QUIGG

Attesting Officer

Commissioner of Patents and Trademarks